United States Patent

Leverington et al.

Patent Number: 5,493,585
Date of Patent: Feb. 20, 1996

[54] SEMI-RECURSIVE ADAPTIVE EQUALIZER

[75] Inventors: Mark Leverington, Champigny; Pascal Hayet, Brunoy; Eric Finco, Evry, all of France

[73] Assignee: U.S. Philips Corporation, New York, N.Y.

[21] Appl. No.: 233,544

[22] Filed: Apr. 26, 1994

Related U.S. Application Data

[63] Continuation of Ser. No. 871,413, Apr. 21, 1992, abandoned.

[30] Foreign Application Priority Data

Apr. 23, 1991 [FR] France .................................. 91 04987

[51] Int. Cl.$^6$ ......................................................... H03H 7/30
[52] U.S. Cl. ....................... 375/232; 375/230; 364/724.20; 333/18
[58] Field of Search ................................. 375/12, 14, 103; 364/724.17, 724.19, 724.20; 333/18, 28 R

[56] References Cited

U.S. PATENT DOCUMENTS

| | | | |
|---|---|---|---|
| 4,495,591 | 1/1985 | Loomis, Jr. | 364/724.17 |
| 4,633,482 | 12/1986 | Sari | 375/14 |
| 5,014,232 | 5/1991 | André | 364/724.19 |
| 5,161,017 | 11/1992 | Sato | 358/166 |

FOREIGN PATENT DOCUMENTS

| | | |
|---|---|---|
| 0347394 | 4/1989 | European Pat. Off. . |
| 55149524 | 11/1980 | Japan . |

OTHER PUBLICATIONS

U.S. patent application Ser. No. 705,823 May 1991 PHA21671.

*Primary Examiner*—Stephen Chin
*Assistant Examiner*—T. Ghebretinsae
*Attorney, Agent, or Firm*—Leroy Eason; Michael E. Marion; Richard A. Weiss

[57] ABSTRACT

An adaptive equalizer includes a digital linear filter having adjustable weighting factors and which is connected to a summator and a control unit so as to form two filter loops, one direct and the other recursive, the filter being shared in both loops. The control unit provides a weighting factor which establishes a selected relative proportioning of the data signals which traverse each loop, so that the equalizer is proportioned as to the degree to which it provides direct filtering and the degree to which it provides recursive filtering. Recursive filtering is employed to the maximum extent consistent with operating stability, the relative proportion of direct filtering being increased as necessary in order to maintain stability during equalization of any particular received data signal.

5 Claims, 3 Drawing Sheets

SEMI-RECURSIVE ADAPTIVE EQUALIZER

This is a continuation of application Ser. No. 07/871,413, filed Apr. 21, 1992, now abandoned.

BACKGROUND OF THE INVENTION

The invention relates to an adaptive equalizer which performs an equalization of a digital input signal transmitted by a channel. Such an equalizer comprises a combination of at least a summer and a digital linear filter B controlled by a clock of period T. The filter B comprises delay cells and calculation cells which apply weighting factors.

The above-described equalizer may be used for correcting distortions produced by a channel while the signal is being transmitted. This may relate to an echo canceller. The transmission may be realized by air or by cable.

The invention may also relate to television signals, or coded or uncoded digital signals.

The possibility of multiple paths when signals are transmitted in the microwave frequency range leads to an echo signal generation. Between an echo and an original signal, short or long delays may occur (which may reach 10 microseconds) with short and/or long echoes. Similar situations occur for digital transmissions, for example, with microwave links.

For performing an equalization of the signals in such situations, an echo canceller is known which is described in the Patent Abstracts of Japan, Vol. 5, No. 23, 12 Feb. 1981, relating to Japanese Application No. 55-149524. That discloses an equalization system which improves operating stability and equalization performance by combining a first filter and a second filter to produce a filter which may be switched between a direct type of operation and a recursive type of operation with the aid of a switch. The second filter is associated with a delay element so that the second filter corrects echoes that have long delays. Due to the switching operation, there is a sudden transition between the two operating modes of the filter.

A same filter having the same coefficients cannot maintain identical operation if it consecutively operates in the direct mode and in the recursive mode. In effect, for a given filter length, a recursive linear filter performs a better filtering than a direct linear filter. But a recursive filter may become unstable under specific circumstances, which is not the case with a direct linear filter. Conversely, a recursive filter intrinsically needs fewer coefficients, thus, fewer multipliers, and also fewer delay cells to obtain a similar filtering performance. Such filters are, thus, much more compact and less costly.

According to the above-mentioned Japanese Patent Abstract, there is a sudden performance degradation when a switching operating is performed in which the switch changes the filter to a direct mode of operation. If, for example, transmitted television pictures are processed in this manner, a mediocre picture quality will result. Thus, a better mastering of the operation of such an echo canceller is to be preferred. In effect, in the varied conditions in which these filters are intended to be used, the filtering quality is to remain excellent. This is especially the case for the equalization of television signals transmitted by a microwave channel. Any unstable situation must then be avoided even temporarily.

SUMMARY OF THE INVENTION

It is an object of the invention to provide an adaptive equalizer which exhibits better performance than the known equalizers. More particularly, the level of performance is not to be changed suddenly, which can hardly be tolerated especially when observing pictures. The equalizer is to have a good stability and reduced complexity. It is to be capable of restoring equalized signals, though imperfectly, in multiple operating conditions. This improvement of performance is obtained in a given filter length, i.e., with the same number of coefficients.

This object is achieved by the adaptive equalizer comprising a control unit which uses a splitting factor $\alpha$ for permitting the filter B to operate in a splitting mode, i.e., the filter B partly having a direct and a recursive type of operation. According to the invention two qualities (i.e., stability and filtering) are advantageously utilized by the filter B being a semi-recursive filter which simultaneously exhibits a recursive behavior and a direct behavior. It is possible to weight the types of behavior relative to one another with the aid of the splitting factor. This is advantageous because it allows the filter in the recursive mode to approach its stability limit in a better way. The equalizer does not undergo sudden operating variations. In this manner, the filtering quality of the recursive behavior is utilized advantageously, while the occurrence of instabilities is avoided.

More particularly, the summer adds together a digital input signal and a digital output signal coming from filter B, while the control unit supplies to the filter B a signal formed by the sum of:

(a) the digital input signal attenuated by a factor $1-\alpha$, and (b) a digital signal coming from the summer, attenuated by a factor $\alpha$.

The importance of this structure is to permit a recursive filtering up to its stability limit. At that point, the filter operation gradually becomes direct, while the same weighting factors are maintained.

It is possible to temporarily displace the operation of the filter B by arranging the filter in series with a delay unit which delays the digital signal of the filter B by a delay r of at least one clock period T. The correction may relate to echoes which have longer delays. The delay unit may be disposed at the input or at the out put of the filter B.

Advantageously, the filter B may then correct long-delay echoes by means of the two operating mechanisms. Nevertheless, when the filter B is connected to a delay unit and the channel presents echoes that have delays between 0 and r, it is incapable of correcting those echoes. Nor is it capable, any more, of correcting echoes preceding the instant t=0 (precursive echoes). For completing the equalization performed by the filter B, the filter B is therefore combined with a digital linear filter A of the direct type, which corrects the short-delay echoes discarded by the filter B.

As it is not always possible to foresee whether the echoes will appear with short or long delays, a combination of the filter A and the filter B comprising a delay unit is preferably used for simultaneously processing these two types of echoes. It is possible to place the filter A either before or after the filter loop that includes filter B.

Such a filter may be used as an adaptive equalizer for processing received signals which have undergone distortion during their transmission by a channel. More particularly, the echo phenomena are rather common when television signals are transmitted by a microwave channel. The equalizer eliminates the echoes of the received signals. However, the echoes may change with time. In order to make the elimination of these echoes possible, the filter B has adjustable coefficients which are to be regularly updated to follow the changes of the channel. A master equalizer eliminates the echoes of the input signals and a slave equalizer calculates the optimum coefficients for each new state of the channel with the aid of reference signals. From time to time the calculated coefficients in the slave equalizer are transferred to the master equalizer.

In this case, and when the equalizer is used without filter A, the equalizer comprises:

(a) a master adaptive equalizer as described hereinbefore, and (b) a slave adaptive equalizer.

The slave adaptive equalizer comprises a second digital linear filter BB, identical to the linear filter B of the master filter, connected in the direct mode for adapting coefficients of the second filter BB by cancelling echoes of a received reference signal transmitted by the channel, and comparing the received reference signal with a locally generated reference signal, the coefficients of the second filter BB being transferred per interval to the filter B of the master equalizer. A stability estimator supplies a control signal ($\alpha$) to the control unit of the filter B of the master adaptive equalizer, which signal ($\alpha$) defines the splitting factor $\alpha$ for a direct and/or recursive mode of operation of the filter B.

If the master equalizer comprises a filter A, the slave equalizer comprises a second filter AA of the digital linear type A. The same steps of coefficient transfer and coefficient calculation used for the filters B and BB are used for the filters A and AA.

To determine whether the newly calculated coefficients can be used for updating the coefficients of the master equalizer, an estimation is made whether an instability can be foreseen with the recursive type. Therefore, a stability estimator determines the sum of the modulus of all the coefficients. This makes it possible to adjust the attenuations $(1-\alpha)$ and $\alpha$ to be applied to the signals coming from the direct path and from the recursive loop respectively.

Such an equalizer may be used for processing television signals which comply with the D2-MAC standard. The reference signal transmitted by the channel and used for updating the coefficients may then be the duobinary signal according to the standard. The locally generated reference signal is thus a local duobinary signal.

It is also possible that the reference signal transmitted by the channel, used for updating the coefficients, is a digitized reference video signal. Because the structure of this signal is known, it is, thus, easy to locally generate, prior to transmission, a reference signal corresponding to the one transmitted by the transmitter. This reference signal may, for example, be formed by digital samples transmitted on a line of a television picture frame.

BRIEF DESCRIPTION OF THE DRAWINGS

The invention will be better understood with the aid of the following drawings, given by way of non-limiting examples, wherein.

DETAILED DESCRIPTION OF THE PREFERRED

EMBODIMENTS OF THE INVENTION

The structure of the equalizer according to the invention is based on the fact that a filter B operating in the recursive mode exhibits better filtering performance than a linear filter B operating in the direct mode for the same number of coefficients. However, the operation of the recursive-type filter may lead to instabilities. The invention thus proposes to preferably operate a linear filter B in the recursive mode, provided that the operation does not become unstable. When an unstable situation is approached, the operation of the linear filter B may be gradually changed from a recursive to a direct mode.

The following description relates basically to the case where the adaptive equalizer comprises a filter A and a filter B including a delay unit (unless stated otherwise). Preferably, the filters A and B have the same number of n of coefficients.

For equalizing a signal that presents short and long echoes, the filter B is to be combined in series with a delay unit $z^{-n}$ (where n is the number of filter coefficients), so that the signal is delayed by n clock periods. In order to ensure that the equalizer has a correct operation for all the types of echoes, when the filter B is connected in the mixed direct/recursive mode, a linear filter A is connected in series. In this manner the equalizer may operate either completely in the direct mode or partly in the direct mode and partly in the recursive mode owing to linear filter A which operates in the direct mode and owing to the linear filter B which operates in the direct and/or recursive mode.

The transfer function of the linear filter A is:

$$G(z) = \sum_{i=1}^{n} g_i \cdot z^{-i} \qquad \text{(Eq. 1)}$$

and that of the linear filter B is:

$$H(z) = \sum_{i=1}^{n} h_i \cdot z^{-i} \qquad \text{(Eq. 2)}$$

There is a reason for distinguishing between the types of echoes that appear in the channel. Echoes are called short echoes when they have delays situated between 0 and nT (where T is the sample period and where n is the length of the filter), and echoes are called long echoes when they have delays situated between $(n+1)T$ and 2nT.

The equalization mechanism of the channel will thus be different depending on whether the filter B operates in the direct or recursive mode.

The invention relates particularly to the correction of long echoes (i.e., between $n+1)T$ and 2nT). In effect, they cannot be corrected by a single filter connected in the direct mode (for a given filter length n). In addition, the invention also relates to the correction of short and long echoes.

For the general case, a channel is considered which presents both short and long echoes. The transfer function of the channel can be written as:

$$1 - \sum_{i=1}^{2n} e_i \cdot z^{-i} \qquad \text{(Eq. 3)}$$

Figures 1A, 1B:
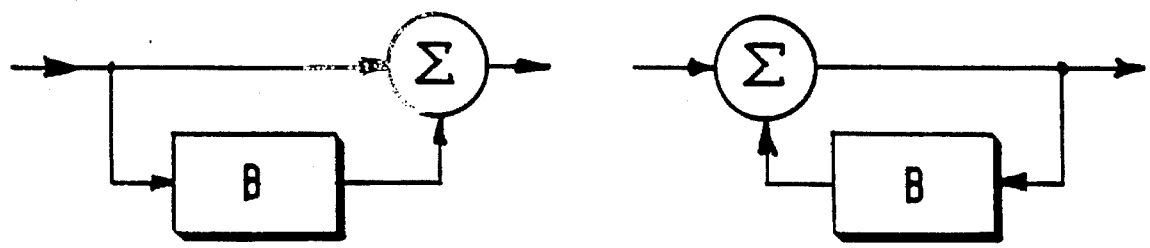
FIGS. 1A and 1B show diagrams of filter B connected in the direct mode and the recursive mode, respectively.

If an equalizer as shown in FIG. 1A is considered, for which the linear filter B is connected in the direct mode, the overall transfer function E(z) can be written as:

$$E(z) = \left(1 - \sum_{i=1}^{2n} e_i \cdot z^{-i}\right)\left(1 + \sum_{i=1}^{n} h_i \cdot z^{-i}\right) \quad \text{(Eq. 4)}$$

Through manipulation, Eq.4 becomes:

$$\text{(Eq. 5)}$$

$$\underbrace{\phantom{xxxxx}}_{P}$$

$$\underbrace{\sum_{i=n+1}^{2n} e_i \cdot z^{-i} - \sum_{i=1}^{2n} e_i \cdot z^{-i} \sum_{i=1}^{n} h_i \cdot z^{-i}}_{Q}$$

The term P relates to short echoes. The term Q relates to long echoes. The first term of Q indicates an absence of equalization between $(n+1)T$ and $2nT$. The second term of Q indicates an imperfect equalization between $1T$ and $2nT$.

If the coefficients $h_i$ are determined for $h_i = e_i$, the term P is eliminated, but the term Q is generally not eliminated. The linear filter B connected in this manner does not correct the term Q.

Alternatively, it is possible to determine the coefficients $h_i$ for minimizing both the terms P and Q. But in this case, $h_i$ is generally different from $e_i$, and the term P is corrected only imperfectly.

According to the invention, one prefers correcting the term P and shifting the term Q to outside the time-dependent correction limits of the filter. Therefore, the filter B is connected in series with a delay means $z^{-n}$.

The overall transfer function $E(z)$ then becomes:

$$E(z) = \left(1 - \sum_{i=1}^{2n} e_i \cdot z^{-i}\right)\left(1 + z^{-n} \cdot \sum_{i=1}^{n} h_i \cdot z^{-i}\right) \quad \text{(Eq. 6)}$$

By manipulation of Eq. 6, it can be written as:

$$E(z) = 1 - \sum_{i=1}^{n} e_i \cdot z^{-i} + \underbrace{z^{-n} \Sigma(h_i - e_{i+n}) \cdot z^{-i}}_{P'} - \quad \text{(Eq. 7)}$$

$$\underbrace{z^{-n} \sum_{i=1}^{n} h_i \cdot z^{-i} \sum_{i=1}^{2n} e_i \cdot z^{-i}}_{Q'}$$

We will restrict ourselves to determining the coefficients $h_i$ for the case where $h_i = e_{i+n}$, while accepting imperfect equalization of the term Q' which cannot be eliminated completely.

The term $$\sum_{i=}^{n} e_i \cdot z^{-i} \quad \text{(Eq. 8)}$$

relates to short echoes which appear in the channel transfer function. Two situations may thus occur:

(a) either this term is zero, because there are no echoes; thus there is no energy between the instants 0 and nT, and the filter B connected in series with the delay unit is sufficient to equalize the channel imperfectly as will be described herein; or (b) the term is not zero, which necessitates additionally inserting a filter A connected in a direct mode for equalizing these short echoes of the channel.

If the linear filter B is connected in the recursive mode according to FIG. 1B, the transfer function $E(z)$ becomes:

$$E(z) = \left(1 - \sum_{i=1}^{2n} e_i \cdot z^{-i}\right) / \left(1 - z^{-n} \cdot \sum_{i=1}^{n} h_i \cdot z^{-i}\right) \quad \text{(Eq. 9)}$$

Through manipulation, Eq. 9 becomes $$E(z) = \underbrace{\left(1 - z^{-n} \sum_{1}^{n} e_{i+n} \cdot z^{-i}\right) / \left(1 - z^{-n} \sum_{i=1}^{n} h_i \cdot z^{-i}\right)}_{P''} \quad \text{(Eq. 10)}$$

$$\underbrace{\left(\sum_{i=1}^{n} e_i \cdot z^{-i}\right) / \left(1 - z^{-n} \sum_{1}^{n} h_i \cdot z^{-i}\right)}_{Q''}$$

It can be shown that the term P" is completely eliminated if $h_i = e_{i+n}$.

The term Q" relates to short echoes which appear in the channel transfer function. Two situations may occur:

(a) either this term is zero because there are no echoes; thus there is no energy between the instants 0 and nT, and the filter B connected in series with the delay unit is sufficient to perfectly equalize the channel as will be described hereinafter; or (b) this term is not zero, which necessitates inserting an additional filter A connected in the direct mode for equalizing these short echoes of the channel.

For correcting the long echoes, one will have a perfect equalization in the recursive mode and a satisfactory but imperfect equalization in the direct mode.

If the number of delays imposed by the delay means $(z^{-n_2})$ is called $n_2$, it will be noticed in either case that the linear filter B cannot correct short delays, i.e., the delays whose transfer function is:

$$\sum_{i=1}^{n_2} e_i \cdot z^{-i} \quad \text{(Eq. 11)}$$

In order to make it possible that these delays are also corrected, the dimension of the linear filter A is to be at least equal to $n_2$, and superior or equal to the dimension n of the linear filter B.

If the dimension of filter B is called $n_1$, the dimension of the delay means is called $n_2$, and the dimension of the filter A is called $n_3$, one must have:

$$n_2 \geq n_i, \ n_3 \geq n_i, \text{ and } n_3 \leq n_2.$$

Preferably, the linear filter A is given the same dimension n as that of the liner filter B, so that the recursive mode of operation of the filter B is the more active. The same dimension n is also given to the delay means.

The linear filter B operates with the same coefficients $h_i$ both in the direct and in the recursive mode of operation. A situation of instability of the recursive mode of operation can be estimated by calculating a stability factor:

$$\sum_{i=1}^{n} |h_i| \quad \text{(Eq. 12)}$$

It will be observed that:

(a) the filter B is stable when operating in the recursive mode, if:

$$\sum_{i=1}^{n} |h_i| < 1 \quad \text{(Eq. 13)}$$

(b) the filter B may be unstable when operating in the recursive mode, if:

$$\sum_{i=1}^{n} |h_i| \geq 1 \qquad \text{(Eq. 14)}$$

The latter situation is to be estimated in advance so as to attribute to the filter B basically or exclusively the direct operating mode if an instability can be foreseen.

If a recursive operating level is defined $\alpha$ and a direct operating level is defined $(1-\alpha)$, the values of $\alpha$ may be defined, for example, by $$\alpha = 1 \text{ if } \sum_{i=1}^{n} |h_i| \leq (1 - \epsilon) \text{ and} \qquad \text{(Eq. 15)}$$

$$\alpha = \frac{1-\epsilon}{\sum_{i=1}^{N} |h_i|} \text{ if } \sum_{i=1}^{n} |h_i| > (1 - \epsilon) \qquad \text{(Eq. 16)}$$

where $\epsilon$ is a very small quantity, for example $\epsilon = 1/20$.

It is also possible to determine the values of $\alpha$ by successive value tests and to, choose the one that provides optimum results. One or more splitting factors can be predetermined for a given type of channel and be stored in a memory, for example, a PROM memory, then loaded in the equalizer as a function of the transmission conditions.

Figure 2:
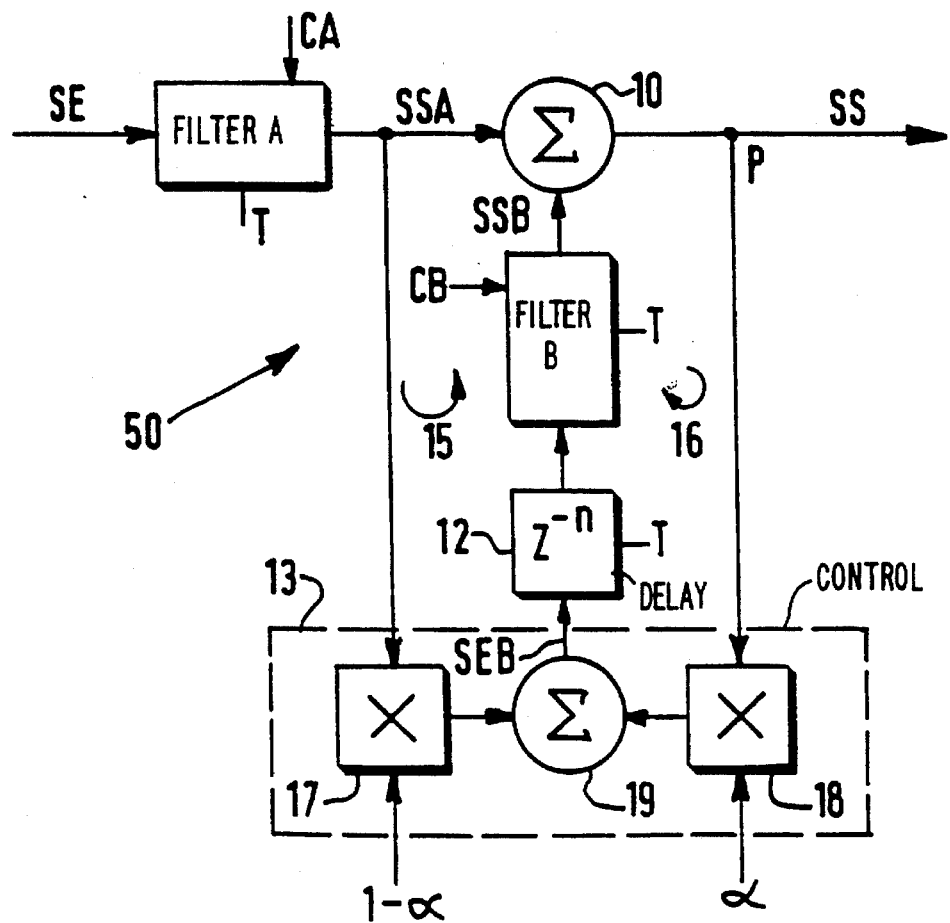
FIG. 2 shows a diagram of a preferred embodiment of a master equalizer in accordance with the invention.

FIG. 2 shows a diagram of a preferred embodiment of an equalizer 50, called a "master equalizer". A summer 10 receives the output signals SSA and SSB from a digital linear filter A and a digital linear filter B, respectively, each having n coefficients. The filter B is preceded by a delay unit 12 which delays by n clock periods T a signal SEB applied to its input. The filters A and B and the delay unit 12 are controlled by the clock having period T. The input data SE enters the filter A. The signal SEB is supplied by a control unit 13 which adds together a part $\alpha$ of the output signal SS of the summer 10 and a part $(1-\alpha)$ of the output signal SSA of the filter A. For this purpose, the control unit 13 comprises:

(a) a first multiplier 18 which supplies a signal $\alpha.SS$;

(b) a second multiplier 17 which supplies a signal $(1-\alpha).SSA$; and (c) a further summer 19 which adds together $\alpha.SS = (1-\alpha).SSA$ to produce SEB.

In this manner the combination of the filter B connected to the delay unit 12 provides a partly direct (non-recursive) mode of operation via loop 15 and a partly recursive mode of operation via loop 16. The value of $\alpha$ permits weighting the splitting between the two modes of operation. The respective coefficients of the filters A and B are regularly updated via the connecting lines CA and CB.

It is possible to insert the delay unit 12 between the filter B and the summer 10. It is likewise possible to insert the filter A behind the point P shared by the summer 10 and the control unit 13. The input data SE then directly enters the summer 10 and the multiplier 17.

Figure 3:
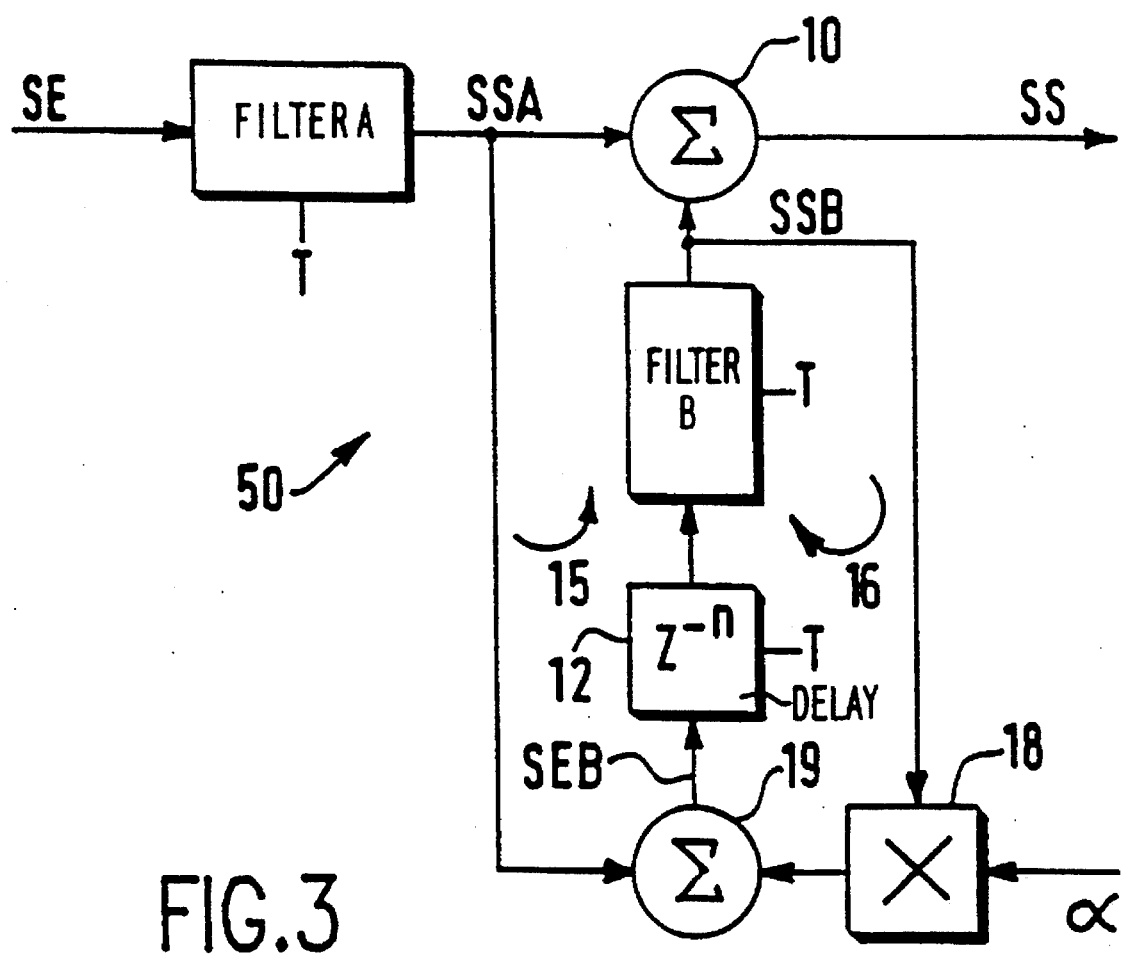
FIG. 3 shows a diagram of another embodiment of the master equalizer according to the invention.

FIG. 3 shows a diagram of a further equalizer 50, also called a "master equalizer", according to the invention. Like elements have like reference characters. The difference consists of the use of only one multiplier 18 instead of two multipliers. The signal entering the multiplier 18 is then tapped from the output of filter B (signal SSB). By one of its inputs, the summer 19 is connected directly to the output of filter A.

Figure 4:
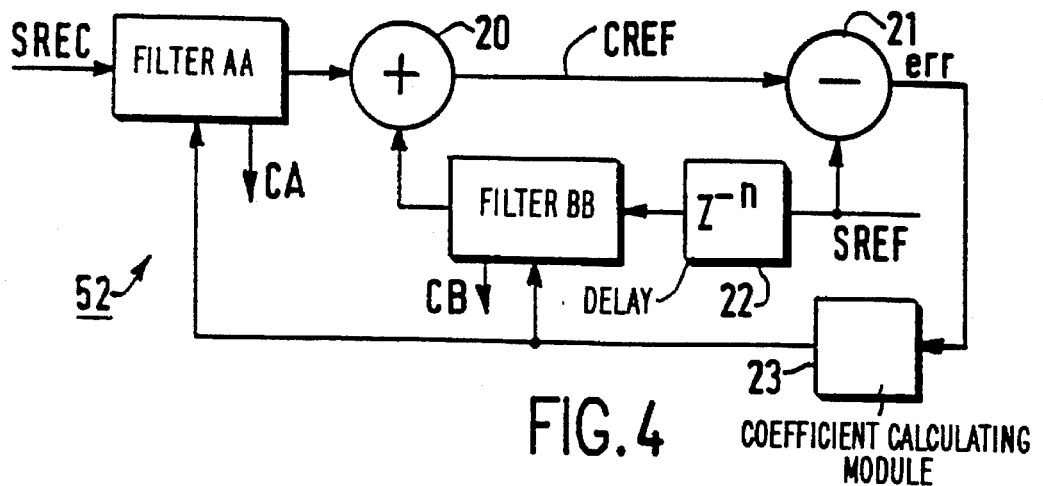
FIGS. 4 and 5 show diagrams of two slave equalizers for determining updated coefficients.

FIG. 4 is a diagram of an equalizer 52, called a "slave equalizer", which equalizer permits determining the coefficients of the adapted filters at an instant at which there is a correct equalization of the transmission channel. For this purpose, it comprises:

(a) a second digital linear filter AA, identical with Filter A;

(b) a second digital linear filter BB, connected in the direct mode; and (c) a second delay unit 22.

A received reference signal SREC enters filter AA. A local reference signal SREF enters the series combination of the delay unit 22 and the filter BB. The local reference signal SREF is the signal to which the received reference signal SREC transmitted by the channel, thus having distortions, is to be compared. An adder 20 adds together the output signals of filters AA and BB and supplies a compound signal CREF. This compound signal is subtracted from the local reference signal SREF in a subtracter 21 which supplies an error signal err. This error signal is fed to a module 23 which calculates the new coefficients of the filters A and B necessary at that instant for equalization of the channel. Therefore, the module 23 uses, for example, the known stochastic gradient algorithm for the mean square error. This is described, for example, in European Patent Application EP-A 0146979.

By calling samples of the local reference signal $\{r_k\}$, and samples of an analog signal transmitted by the channel $\{y_k\}$, the error signal err can be written for the order of k as:

$$err_k = \sum_{i=1}^{n} g_i \cdot y^{k-1} + \sum_{i=n+1}^{2n} h_j \cdot r^{k-1} - r_k \qquad \text{(Eq. 17)}$$

The stochastic gradient algorithm makes it possible to calculate the new coefficients which minimize this error $err_k$.

For each step of the order of L, the coefficients of the filters AA and BB are determined according to:

$$g_i^L = g_i^{L-1} - \delta e_k \cdot Y_{k-1} \quad 1 \leq i \leq n \qquad \text{(Eq. 18)}$$

$$h_i^L = h_i^{L-1} - \delta e_k \cdot R_{k-i} \quad n+1 \leq i \leq 2n \qquad \text{(Eq. 19)}$$

where $\delta e_k$ is an adaptation step.

When the coefficients of the filters AA and BB have been determined, they are transmitted (connecting lines CA and CB) to the filters A and B of the master equalizer.

If the equalizer operates without the assistance of a slave equalizer, an analogous adaptation procedure is used for the filter B at instants when the filter B is available, for example, during the operation of the equalizer. It is also possible to load predetermined coefficients, for example, stored in a PROM memory in the equalizer.

Figure 5:
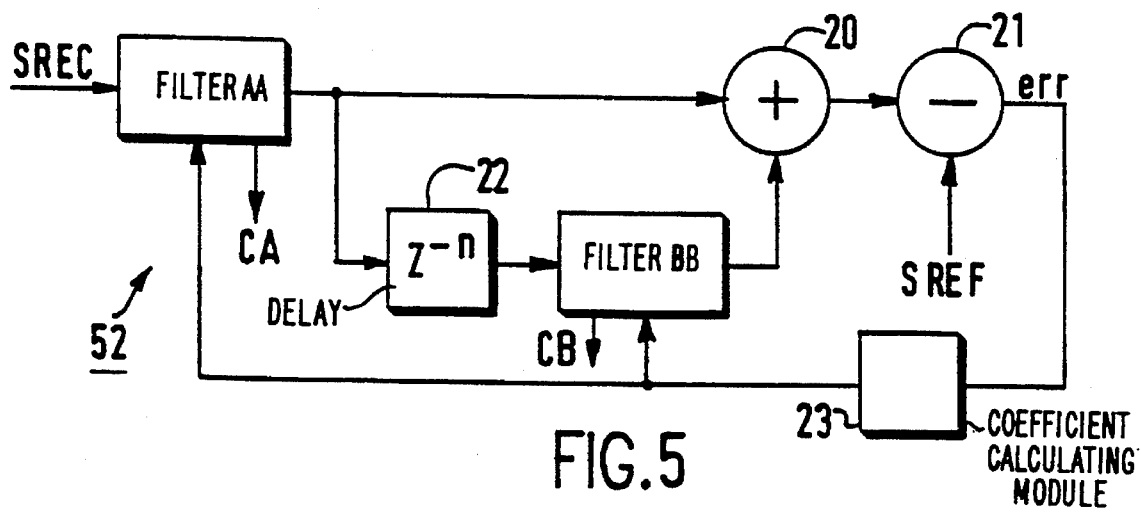

FIG. 5 is a further diagram of a "slave equalizer". It comprises the same elements as FIG. 4 but connected in a different manner. In this case, the output signal of the filter AA enters the series combination of the delay unit 22 and the filter BB. The adder 20 adds together the output signals of the filter AA and BB. The filter AA receives at it input the received reference signal SREC. The local reference signal SREF arrives at an input of the subtracter 21 which receives the output signal of the adder 20 through another input. The error signal err of the subtracter is used in the same manner as described hereinbefore. The new coefficients are determined and updated in the filters A and B in the manner described hereinbefore.

The positions of the filter BB and of the delay unit 22 may be interchanged.

It is possible for those skilled in the art to determine the filter coefficients in a different manner without departing from the scope of the invention. The "slave equalizer" may even be simplified by not utilizing filter AA if the filter A does not exist.

Such an equalizer may be used for operation with television signals, for example, having the D2-MAC standard. The equalizer is first to determine its optimum operation with the aid of reference signals (received and local) after which the equalization of the television signals themselves can be performed.

Figure 6:
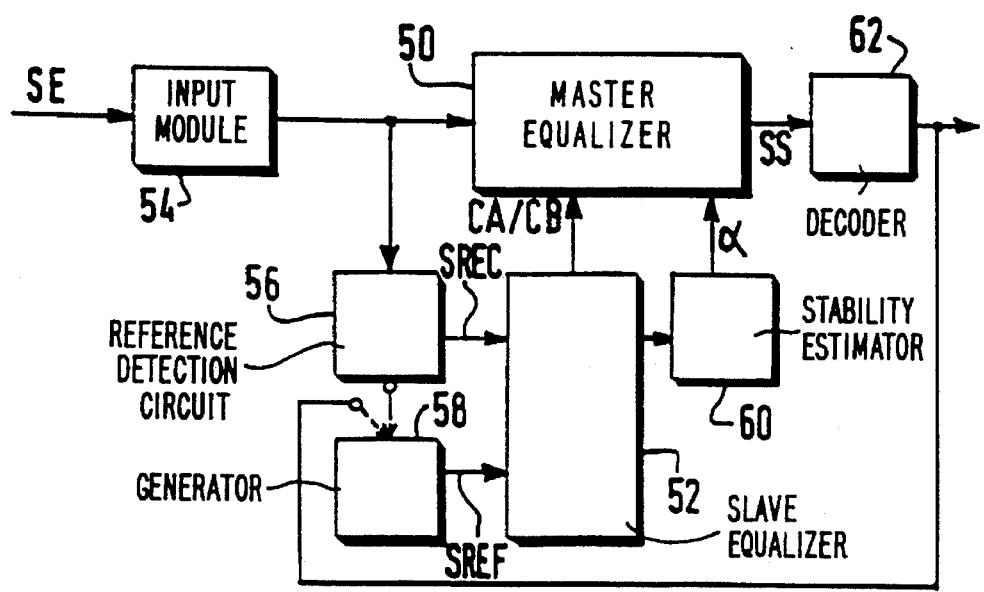
FIG. 6 shows a diagram of an equalizer in accordance with the invention having a master equalizer and a slave equalizer influencing signals transmitted by a channel.

FIG. 6 shows the diagram of an equalizer comprising a "master equalizer" 50 and a "slave equalizer" 52, both having analog structures. The input signal SE enters an input module 54 which preprocesses, i.e., digitizes the signal, a clamping circuit, and an automatic gain controller. The preprocessed input signal SE is fed to the "master equalizer" 50, so that an equalized output signal SS is supplied.

For permitting updating of the coefficients, a circuit 56 detects the reference signal SREC contained in the input signal SE. When the reference signal SREC transmitted on a reference line of a television frame (cf. hereinbelow) is received, the circuit 56 activates a generator 58 which generates a local reference signal SREF. If the reference signal is a duobinary signal (cf. hereinbelow), the reference signal SREF is formed by the generator 58 on the basis of the equalized duobinary signal decoded by the decoder 62. The signals SREC and SREF are fed to the "slave equalizer" 52 which determines the coefficients as described hereinbefore. A stability estimator 60 then determines the stability that can be foreseen with the linear filter B by calculating the sum of the new coefficients $h_i$, i.e., the stability factor. The stability estimator 60 then supplies a signal representing the coefficient $\alpha$, i.e., the splitting factor. The new coefficients $g_i$ and $h_i$ are transmitted to the "master equalizer" via the connecting lines CA and CB.

The choice of the reference signal is to be made on the basis of its spectral characteristic values and is to be as uncorrelated as possible (which corresponds to a constant-power spectral density over the whole frequency spectrum). For partly satisfying these conditions, it is possible to use a duobinary digital data signal transmitted according to the D2-MAC standard. The duobinary code is obtained from an arithmetical addition of a binary signal to be coded and a signal of its own value delayed by one clock pulse. This code realizes filtering with a raised cosine which restricts the spectrum to half the clock frequency. The absence of energy beyond 5 MHz does not permit equalization of the channel in this range. This disadvantage does not affect the equalization of the so-called duobinary signal, but it restricts the performance as regards the video signal (high-frequency residual signals). The D2-MAC signal comprises 208 duobinary samples per line. In the case where an equalization filter comprises 50 coefficients, one has the disposal of approximately 150 repetitions per line. The convergence (more than 1500 repetitions) in the image (40 ms) is thus largely ensured. A duobinary decoder 62 is then used for restoring the binary signal itself. For locally generating the duobinary reference signal SREF, the generator 58 (FIG. 6) is then a duobinary coder recoding the binary signal, decoded by the decoder 62, into a duobinary signal.

Another possibility consists of using a special line of a television frame for transmitting a reference signal of known structure. Then, the line 624 reserved for a wobbling signal defined by 512 samples may be used for this purpose. Such a reference signal having the same dynamic as the video component is formed by a real portion transmitted to the even images and an imaginary portion transmitted to the odd images. Each of these components arbitrarily produces a reference signal which is ideal for equalization. In effect, a signal is available whose energy stretches over the whole spectrum, which allows more than 256 repetitions per image (convergence in 80 to 120 ms).

We claim:

1. An adaptive equalizer for equalizing a digital signal, the equalizer having a signal input for receiving the digital signal and a signal output for providing an equalized output signal, the equalizer comprising:

a filter simultaneously operating partly as a direct filter and partly as a recursive filter for providing a filter output signal, the degree to which said filter operates as a recursive filter and as a direct filter being determined by a splitting factor;

slave equalizer means for controlling operating coefficients of said filter, said slave equalizer means being coupled to said signal input and said filter;

stability estimating means coupled to said slave equalizer means and to said filter, for (a) deriving a stability factor indicating a degree of stability of said filter on the basis of said operating coefficients, and (b) deriving said splitting factor on the basis of said stability factor; and a summer coupled to said signal input and said filter, which sums the digital signal and the filter output signal to form the equalized output signal.

2. An adaptive equalizer for equalizing a data signal received at an input thereof, the equalized data signal being produced at an output thereof; said equalizer comprising:

digital summation means having first and second inputs and an output, said output being coupled to the equalizer output;

means for coupling the equalizer input to the first input of said summation means;

first linear digital filter means having an input and having an output which is coupled to the second input of said summation means, said first filter means providing digital filtering of a data signal supplied to the input thereof in accordance with a first series of filter coefficients so as to produce at the output thereof a filtered data signal which is supplied to the second input of said summation means;

said summation means combining said filtered data signal with a data signal received at said first input thereof to derive said equalized data signal at the output thereof; and a control unit having an output coupled to the input of said first filter means, a first input coupled to the first input of said summation means, and a second input coupled to the output of either of said summation means and said first filter means;

said control unit being operative to derive preselected relative proportions of data signals at the first and second inputs thereof and to combine the proportioned data signals to produce a combined data signal which is supplied to the input of said first filter means, thereby establishing for said first filter means (i) a direct non-recursive filter loop with respect to at least a portion of data signals received at the first input of said summation means, and (ii) a recursive filter loop with respect to at least a portion of said filtered data signal produced by said first filter means;

whereby the data signal received at the input of said equalizer is concurrently subjected to direct non-recursive filtering and recursive filtering in said preselected relative proportions.

3. An adaptive equalizer as claimed in claimed in claim 2, further comprising delay means in series with said first filter means between the output of said control unit and the second input of said summation means.

4. An adaptive equalizer as claimed in claim 3, wherein said means for coupling the input of said equalizer to the first input of said summation means comprises second linear digital filter means; said second filter means providing digital filtering of the received data signal in accordance with a second series of filter coefficients, so as to supply a filtered received data signal to the first input of said summation means; the filtering provided by said first and second filter means respectively correcting the received data signal for relatively longer and shorter delay echoes thereof.

5. An adaptive equalizer as claimed in claim 2, further comprising slave equalizer means for receiving a reference signal included in the input data signal and deriving a third series of filter coefficients for use by said slave equalizer means as applied to said reference signal; and stability estimating means coupled to said slave equalizer means for (a) deriving a stability factor indicating a degree of stability of operation of recursive filtering using said third series of filter coefficients as applied to said reference signal, (b) on the basis of said stability factor, determining the preselected relative proportions of direct and recursive filtering to be provided by said first filter means, and (c) causing said control unit to combine the data signals at the first and second inputs thereof in the so-determined relative proportions.

* * * * *